US008968467B2

(12) United States Patent
Kirscht et al.

(10) Patent No.: US 8,968,467 B2
(45) Date of Patent: *Mar. 3, 2015

(54) METHOD AND SYSTEM FOR CONTROLLING RESISTIVITY IN INGOTS MADE OF COMPENSATED FEEDSTOCK SILICON

(75) Inventors: Fritz Kirscht, Berlin (DE); Marcin Walerysiak, Skrzeszew (PL); Matthias Heuer, Berlin (DE); Anis Jouini, Grenoble (FR); Kamel Ounadjela, Belmont, CA (US)

(73) Assignee: Silicor Materials Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/618,577

(22) Filed: Nov. 13, 2009

(65) Prior Publication Data

US 2010/0258768 A1    Oct. 14, 2010

Related U.S. Application Data

(63) Continuation-in-part of application No. 11/769,109, filed on Jun. 27, 2007, now Pat. No. 7,651,566.

(51) Int. Cl.
  *C30B 15/00* (2006.01)
  *C30B 11/00* (2006.01)
  *C30B 11/04* (2006.01)
  *C30B 29/06* (2006.01)

(52) U.S. Cl.
  CPC ............. *C30B 11/006* (2013.01); *C30B 11/04* (2013.01); *C30B 29/06* (2013.01)
  USPC ................ 117/13; 117/11; 423/324; 423/326

(58) Field of Classification Search
  USPC .................. 423/324, 326, 327.1; 117/11, 13
  See application file for complete search history.

(56) References Cited

U.S. PATENT DOCUMENTS

| | | | |
|---|---|---|---|
| 4,247,528 A | 1/1981 | Dosaj et al. | |
| 4,312,700 A | 1/1982 | Helmreich et al. | |
| 4,927,489 A | 5/1990 | Campbell et al. | |
| 5,156,978 A | 10/1992 | Bathey et al. | |
| 6,254,674 B1 | 7/2001 | Aydelott | |
| 6,294,726 B1 | 9/2001 | Hassler et al. | |
| 7,651,566 B2 | 1/2010 | Kirscht et al. | |
| 2004/0067647 A1 | 4/2004 | Saito | |
| 2005/0112855 A1 | 5/2005 | Cretella et al. | |
| 2005/0207960 A1 | 9/2005 | Saito | |
| 2007/0128099 A1 | 6/2007 | Enebakk et al. | |
| 2008/0220544 A1* | 9/2008 | Bucher et al. ................ | 438/11 |

FOREIGN PATENT DOCUMENTS

| | | |
|---|---|---|
| DE | 3150539 | 6/1983 |
| DE | 3150539 A | 6/1983 |
| DE | 3804069 A | 8/1989 |
| EP | 1061160 | 12/2000 |
| EP | 1417702 B1 | 10/2011 |
| JP | 2004140120 A | 5/2004 |
| JP | 2010531805 A | 9/2010 |
| WO | WO2004/036657 | 4/2004 |
| WO | WO-2004036657 A1 | 4/2004 |
| WO | W02007/001184 | 1/2007 |
| WO | WO-2007001184 A1 | 1/2007 |
| WO | WO-2009003183 A1 | 12/2008 |

OTHER PUBLICATIONS

"European Application Serial No. 08772195.7, European Search Report mailed Jul. 6, 2010", 4.

"European Application Serial No. 08772195.7, Examination Notification Art. 94(3) mailed Oct. 6, 2010", 5 pgs.

Sarti, D, et al., "Silicon feedstock for the multi-crystalline photovoltaic industry", Solar Energy Materials and Solar Cells, 72(1-4), Elsevier Science Publishers, Amsterdam NL, XP004339747, ISSN: 0927-0248, (Apr. 1, 2002), 27-40.

Australian Research Council, University of New South Wales, "Third Generation Photovoltaics 2002 Annual Report".

Ciszek T.F. et al., "Alternative solar-grade silicon feedstock approaches", NREL Conference Paper, The NCPV Program Review Meeting, Lakewood, Colorado, Oct. 14-17, 2001.

"U.S. Appl. No. 11/769,109, Examiner Interview Summary filed Jun. 24, 2009", 5 pgs.

"U.S. Appl. No. 11/769,109, Non Final Office Action mailed Apr. 6, 2009", 18 pgs.

"U.S. Appl. No. 11/769,109, Notice of Allowance mailed Sep. 28, 2009", 7 pgs.

(Continued)

*Primary Examiner* — Mark Kopec
*Assistant Examiner* — Haidung Nguyen
(74) *Attorney, Agent, or Firm* — Schwegman Lundberg & Woessner, P.A.

(57) ABSTRACT

Techniques for controlling resistivity in the formation of a silicon ingot from compensated feedstock silicon material prepares a compensated, upgraded metallurgical silicon feedstock for being melted to form a silicon melt. The compensated, upgraded metallurgical silicon feedstock provides semiconductor predominantly of a single type (p-type or n-type) for which the process assesses the concentrations of boron and phosphorus and adds a predetermined amount of boron, phosphorus, aluminum and/or gallium. The process further melts the silicon feedstock with the boron, phosphorus, aluminum and/or gallium to form a molten silicon solution from which to perform directional solidification and maintains the homogeneity of the resistivity of the silicon throughout the ingot. A balanced amount of phosphorus can be optionally added to the aluminum and/or gallium. Resistivity may also be measured repeatedly during ingot formation, and additional dopant may be added in response, either repeatedly or continuously.

12 Claims, 7 Drawing Sheets

(56) References Cited

OTHER PUBLICATIONS

"U.S. Appl. No. 11/769,109, Response filed Jun. 29, 2009 to Non Final Office Action mailed Apr. 6, 2009", 11 pgs.

"Chinese Application Serial No. 200880105605.X, Office Action mailed Mar. 27, 2013", w/English translation, 9 pgs.

"Chinese Application Serial No. 200880105605.X, Office Action mailed May 22, 2012", (w/English Translation), 20 pgs.

"Chinese Application Serial No. 200880105605.X, Response filed Oct. 8, 2012 to Office Action mailed May 22, 2012", 5 pgs.

"European Application Serial No. 08772195.7, Notice of Opposition filed Aug. 1, 2012", 15 pgs.

"European Application Serial No. 08772195.7, Response filed Feb. 1, 2011 to Examination Notification Art. 94(3) mailed Oct. 6, 2010", 18 pgs.

"European Application Serial No. 11188326.0, Extended European Search Report mailed Aug. 2, 2012", 4 pgs.

"European Application Serial No. 11188326.0, Response filed Mar. 5, 2013 to Extended European Search Report mailed Aug. 2, 2012", 5 pgs.

"International Application Serial No. PCT/US2008/068644, International Preliminary Report on Patentability dated Jan. 5, 2010", 8 pgs.

"International Application Serial No. PCT/US2008/068644, International Search Report mailed Sep. 29, 2008", 2 pgs.

"International Application Serial No. PCT/US2008/068644, Written Opinion mailed Sep. 29, 2008", 7 pgs.

"Japanese Application Serial No. 2010-515195, Office Action mailed Mar. 19, 2013", 4 pgs.

"Japanese Application Serial No. 2010-515195, Voluntary Amendment filed Jun. 23, 2011", w/English translation, 15 pgs.

Fujii, S, et al., "High Efficiency Gallium Doped and Boron Doped Multicrystalline Silicon Solar Cells", 3rd World Conference on Photovotaic Energy Conversion, Osaka, Japan, (May 2003), 1493-1495.

Chinese Application Serial No. 200880105605.X, Decision on Rejection mailed Oct. 14, 2013, 8 pgs.

Chinese Application Serial No. 200880105605.X, Response filed Jan. 27, 2014 to Office Action mailed Oct. 14, 2013, 14 pgs.

Chinese Application Serial No. 200880105605.X, Response filed Jun. 9, 2013 to Office Action mailed Mar. 27, 2013, 8 pgs.

Japanese Application Serial No. 2010-515195, Office Action mailed Jul. 16, 2013, 2 pgs.

Japanese Application Serial No. 2010-515195, Office Action mailed Nov. 26, 2013, 2 pgs.

Japanese Application Serial No. 2010-515195, Response filed Jun. 18, 2013 to Office Action mailed Mar. 19, 2013, 8 pgs.

Japanese Application Serial No. 2010-515195, Response filed Oct. 15, 2013 to Office Action mailed Jul. 16, 2013, 7 pgs.

Brown, Gregory, et al., "Third Generation Photovoltaics", (2009), 12 pgs.

"European Application Serial No. 08772195.7, Communication of a Notice of Opposition mailed Aug. 16, 2012", 1 pg.

"European Application Serial No. 08772195.7, Communication of Further Notices of Opposition mailed Oct. 15, 2012", 2 pg.

"European Application Serial No. 08772195.7, Decision to Discontinue the Opposition Proceedings mailed Mar. 5, 2013", 2 pgs.

"European Application Serial No. 08772195.7, Replacement EPO Form 2300 Notice of Opposition mailed Aug. 8, 2012", 5 pgs.

"European Application Serial No. 08772195.7, Response filed Mar. 5, 2013 to Communication of Further Notices of Opposition mailed Oct. 15, 2012", 2 pgs.

"European Application Serial No. 08772195.7, Withdrawal of an Opposition mailed Jan. 29, 2013", 1 pg.

Japanese Application Serial No. 2010-515195, Response filed Mar. 11, 2014 to Office Action mailed Nov. 26, 2013, 8 pgs.

\* cited by examiner

METHOD AND SYSTEM FOR CONTROLLING RESISTIVITY IN INGOTS MADE OF COMPENSATED FEEDSTOCK SILICON

FIELD

The present disclosure relates to methods and systems for use in the fabrication of semiconductor materials such as silicon. More particularly, the present disclosure relates to a method and system for controlling resistivity in the formation of p-type silicon ingots that permits the use of low-grade silicon feedstock, for fabricating silicon that may be ultimately useful in the manufacturing of solar cells and similar products.

DESCRIPTION OF THE RELATED ART

The photovoltaic industry (PV) industry is growing rapidly and is responsible for increasing industrial consumption of silicon beyond the more traditional integrated circuit (IC) applications. Today, the silicon needs of the solar cell industry are starting to compete with the silicon needs of the IC industry. With present manufacturing technologies, both IC and solar cell industries require a refined, purified silicon feedstock as a starting material.

Materials alternatives for solar cells range from single-crystal, electronic-grade (EG) silicon to relatively dirty, metallurgical-grade (MG) silicon. EG silicon yields solar cells having efficiencies close to the theoretical limit, but at a prohibitive price. On the other hand, MG silicon typically fails to produce working solar cells. However, there may be other semiconductor materials that could be useful for solar cell fabrication. In practice, however, nearly 90% of commercial solar cells are made of crystalline silicon.

Because of the high cost and complex processing requirements of obtaining and using highly pure silicon feedstock and the competing demand from the IC industry, silicon needs usable for solar cells are not likely to be satisfied by either EG, MG, or other silicon producers using known processing techniques. As long as this unsatisfactory situation persists, economical solar cells for large-scale electrical energy production may not be attainable.

The resistivity is one of the most important properties of silicon (Si) used for manufacturing solar cells. That is because the solar cell efficiency sensitively depends on the resistivity. State-of-the-art solar cell technologies require resistivity values ranging between 0.5 $\Omega$cm and 5.0 $\Omega$cm, typically.

Besides the resistivity range, the type of conductivity is of utmost importance when making solar cells. Conductivity needs to be either p-type or n-type, i.e., either electrons or holes are the majority current carriers. In current cell technologies, p-type silicon material is typically doped with boron (B), which introduces holes or, expressed differently, acts as an acceptor in respective silicon. Alternatively, n-type material may be used. Such material is typically doped with phosphorus (P), which introduces electrons. Expressed differently, phosphorus is acting as a donor.

Feedstock silicon materials based on upgraded metallurgical (UM) silicon very often contain similar amounts of B and P. As a consequence, boron-induced holes and phosphorus-induced electrons can cancel each other, an effect called compensation. The compensation of majority current carriers often leads to a transition from p-type silicon (in the beginning of a crystallization process) to n-type silicon (at the end of a crystallization process). This is a consequence of different segregation behavior of these doping elements: phosphorus has a smaller segregation coefficient than boron. Thereby, in the case of casting ingots for producing multi-crystalline (mc) Si, the process might end up with p-type material only in the bottom and middle parts of such ingots, whereas the top part becomes n-conductive and has to be discarded.

Currently produced feedstock materials based on UMG silicon come often with a base resistivity below the minimum resistivity of 0.5 $\Omega$cm that is typically specified by solar cell manufacturers. There is a simple reason for this: expensive processes for upgrading UMG-Si are primarily concerned with taking out non-metals, including dopant atoms B and P. In order to reduce cost, there is a clear tendency to minimize such processing, i.e., UMG-Si typically still contains high concentrations of dopant atoms. As long as boron is the dominating dopant we get p-type material with relatively low resistivity.

Compensation of boron by phosphorus—increasing with ongoing crystallization due to different incorporation of B and P at solidification—results in increasing resistivity with ongoing crystallization. So, the typically very low resistivity at the beginning of crystallization increases with ongoing crystallization. However, as already stated, there is the general problem of too heavy resistivity increase due to overcompensation of B by P, resulting in a transition of conductivity from p-type to n-type. The initial addition of boron for suppressing such a transition is not practical because one would even further reduce the resistivity in bottom and middle parts of, e.g., an ingot of mc-Si.

Accordingly, a need exists to control the compensation effect of the material, in order to increase the portion of p-type silicon material in ingots thereby increasing the yield of such material.

SUMMARY

Techniques are here disclosed for providing a combination of interrelated steps at the ingot formation level for ultimately making economically viable the fabrication of solar cells on a mass production level. The present disclosure includes a method and system for forming multi-crystalline silicon ingots, which ingots possess uniformly p-type semiconductor material along essentially all of the ingot axial length. With the disclosed process and system, silicon ingots may be formed directly within a silicon melt crucible. For example, using mc-Si ingots formed from the processes here disclosed, solar wafers and solar cells can be made with improved performance/cost ratio, based on this mc-Si material.

According to one aspect of the disclosed subject matter, a semiconductor ingot-forming method and system permit controlling resistivity in the formation of a silicon ingot by preparing UMG silicon feedstock for being melted to form a silicon melt. The present disclosure assesses the concentrations of boron and phosphorus in said UMG-Si feedstock material. Our approach of choice is analyzing the initial incorporation of B and P by in-situ measuring the resistivity in the moment when the ingot formation process starts. Based on this assessment, a predetermined amount of an element of group III of the periodic system, which can be Ga, Al, a combination of Ga and Al, or another group III element, is added to the UMG-Si feedstock material during the crystallization of a large-size ingot. The predetermined quantity of such group III element(s) associates with the assessed B and P concentrations.

The present disclosure includes melting the UMG-Si feedstock and the added group III element(s) to form a molten silicon solution including the predetermined amount of group III element(s); performing a directional solidification of the molten silicon solution for forming a silicon ingot and, by virtue of the adding a predetermined amount of the group III element(s), maintaining the homogeneity the resistivity of the silicon ingot throughout the silicon ingot. Below certain resistivity it becomes advantageous to add P or other group V elements to the group III element(s). This way the useful resistivity range of reasonably yielding p-type ingots made of compensated UMG-Si feedstock can be extended.

In one embodiment, the present disclosure also includes methods for repeatedly measuring the dopant concentrations in the silicon melt during ingot formation, by testing resistivity in a sample. The dopant concentrations may then be repeatedly adjusted by adding discrete amounts of dopant in order to keep the resistivity of the ingot within a predetermined range.

In another embodiment, dopant concentrations in the silicon melt may be continuously adjusted by a flow of dopant, rather than repeatedly tweaked by discrete additions of dopant. In this embodiment, the repeated resistivity measurements may be fed into a resistivity model that outputs the required flow rate of a group III or group V element, which may in turn be fed into the melt.

These and other advantages of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following figures and detailed description. It is intended that all such additional systems, methods, features and advantages be included within this description, be within the scope of the accompanying claims.

BRIEF DESCRIPTIONS OF THE DRAWINGS

The features, nature, and advantages of the disclosed subject matter may become more apparent from the detailed description set forth below when taken in conjunction with the drawings in which like reference characters identify correspondingly throughout and wherein:

FIG. 1 demonstrates one aspect of forming a silicon ingot that the present disclosure addresses;

Figure 7:
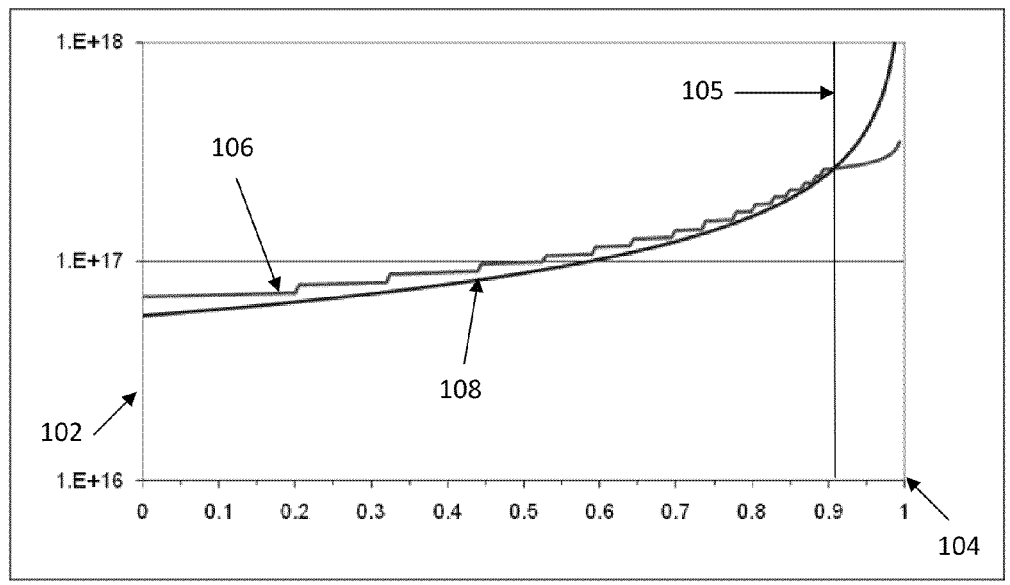
Figure 8:
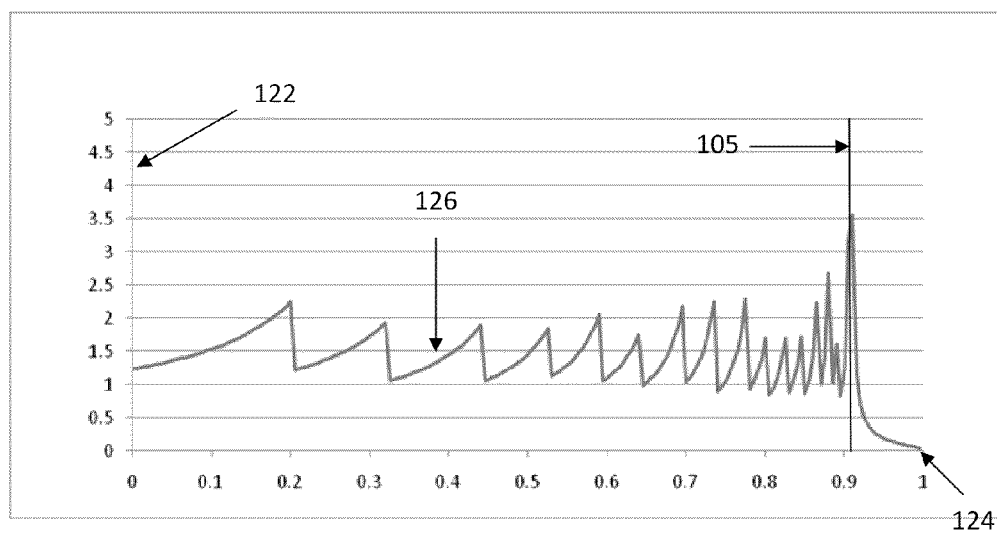
Figure 9:
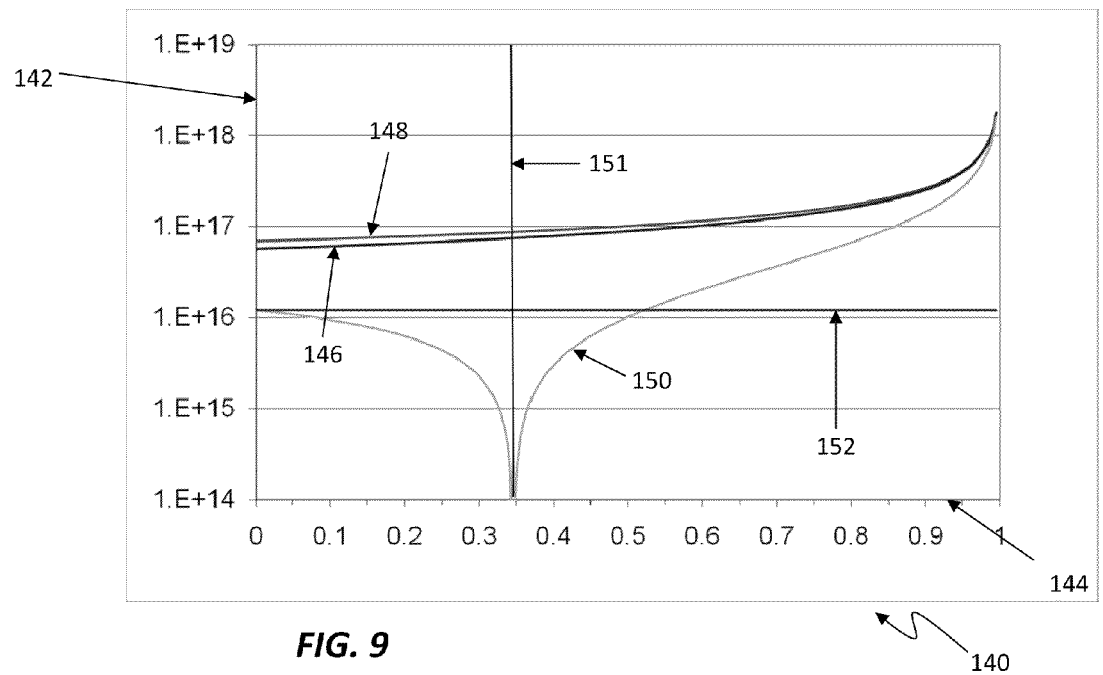
Figure 10:
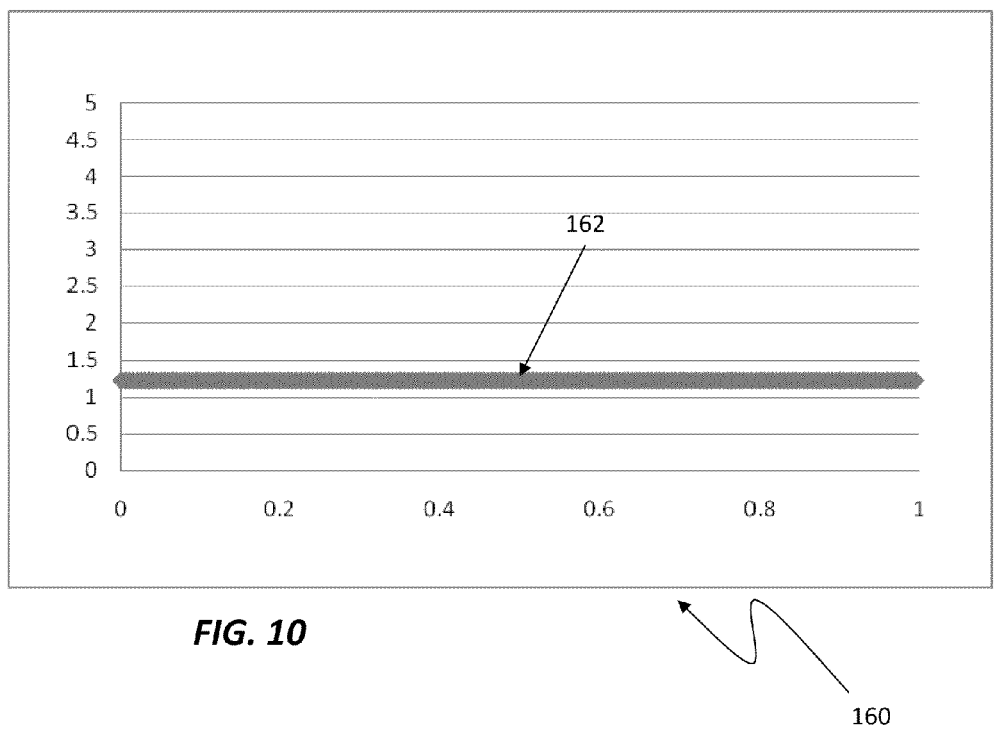
Figure 11:
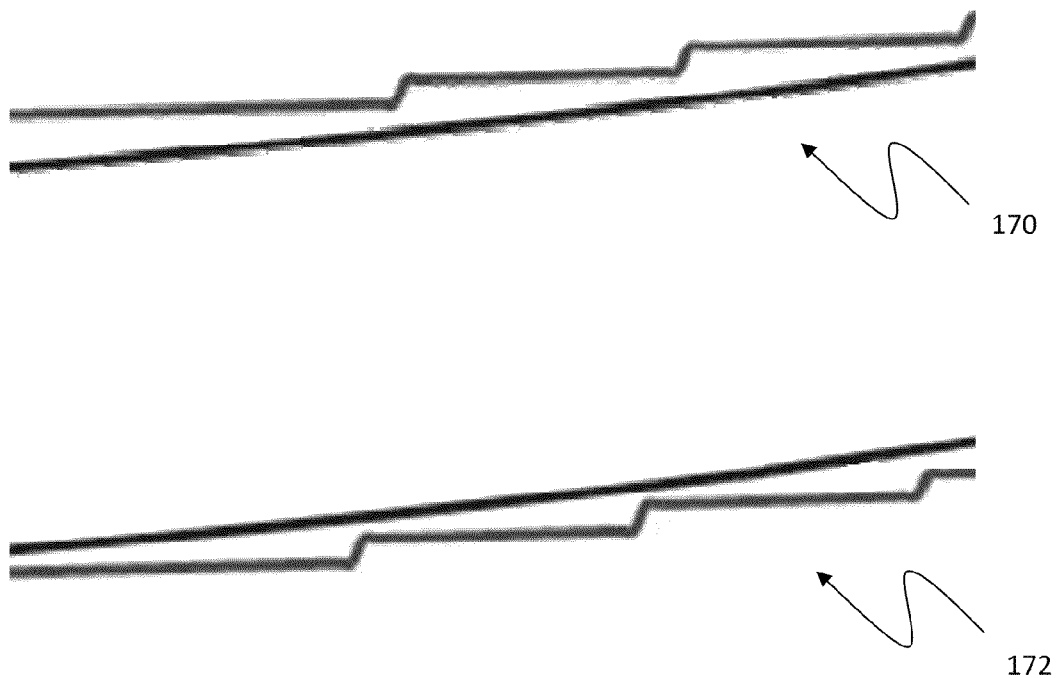
Figure 12:
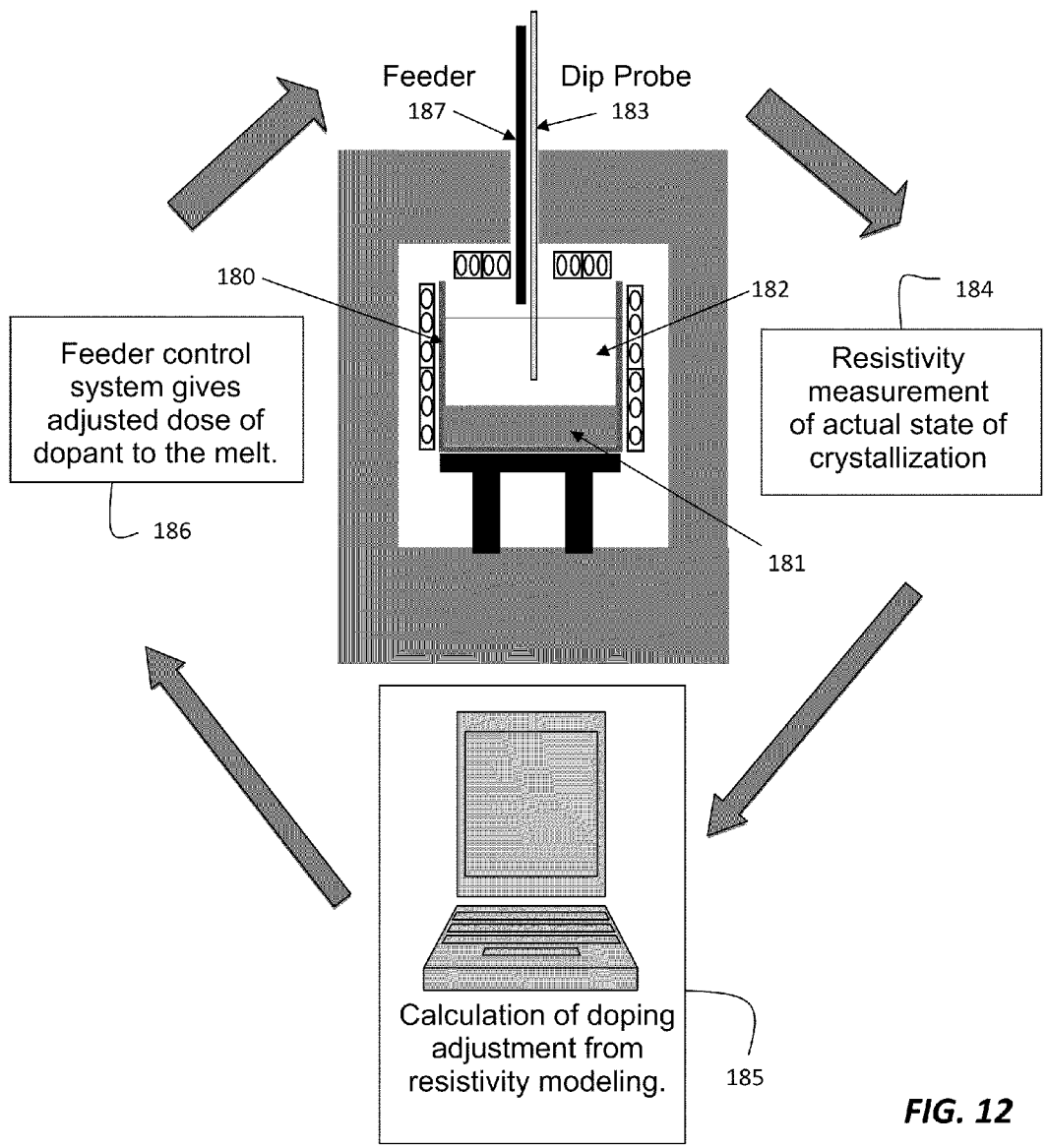

FIG. 7 demonstrates one aspect of forming a silicon ingot using repeated additions of dopant that the present disclosure addresses;

FIG. 8 depicts the axial resistivity profile of an ingot made using repeated additions of dopant;

FIG. 9 demonstrates one aspect of forming a silicon ingot using continuous flow of dopant that the present disclosure addresses;

FIG. 10 depicts the axial resistivity profile of an ingot made using continuous flow of dopant;

FIG. 11 demonstrates embodiments of the present disclosure for forming both p-type and n-type semiconductor ingots; and FIG. 12 shows an embodiment of a continuous doping system in accordance with the present disclosure.

DETAILED DESCRIPTION OF THE SPECIFIC EMBODIMENTS

The method and system of the present disclosure provide a semiconductor ingot formation process for producing a multi-crystalline silicon ingot. As a result of using the disclosed subject matter, an improvement in the properties of low-grade semiconductor materials, such as upgraded, partially purified metallurgical silicon occurs. Such improvement allows, for example, the use of UMG-Si in producing solar cells as may be used in solar power generation and related uses. The method and system of the present disclosure, moreover, particularly benefits the formation of solar cells using UMG or other non-electronic grade feedstock silicon materials, but can be used for electronic grade feedstock silicon too.

Directional solidification (DS) leads to characteristic axial distribution of impurities (I), controlled by impurity-specific segregation characteristics. The so-called segregation coefficient S that describes segregation characteristics is described by the following simplified expression:

$$S(I)=f(C(I)_{crystal}/C(I)_{melt})$$

where, $S(I)$ represents the segregation coefficient of a specific impurity like dopant atoms, for example I=B or I=P;

$C(I)_{crystal}$ represents the concentration of, e.g., B or P in the solidified, crystalline silicon; and $C(I)_{melt}$ represents the concentration of, e.g., B or P in the silicon melt.

If both boron and phosphorus are present in feedstock material used for DS crystallization of silicon, from the variation of axial resistivity after crystallization it is possible to conclude on the concentration ratio B/P in respective feedstock silicon material. Conveniently, a small (e.g. from a charge size of only a few hundred grams of feedstock material) ingot or crystal is sufficient to get reliable axial resistivity profiles, as long as the feedstock sampling reflects characteristic feedstock composition with respect to the concentration of B and P. Most important is the assessment of the initial incorporation of B and P in such a small reference ingot to find the right amount of dopants added in the beginning of the process, but with the present disclosure even this is not necessary anymore. However, we have applied this methodology for investigating feedstock materials with different B/P ratios.

At B/P ratios close to 2 and below, we have seen a transition from p-conductivity to n-conductivity in respective ingots, leading to yield loss of usable p-type material of at least 10%. Typically, the portion of n-type material and the corresponding yield loss of p-type material can be up to almost 50%. The methods of the present disclosure may significantly improve the distribution of axial resistivity in ingots made from feedstock material with such compensation-related transition of conductivity. These methods allow the complete suppression of the transition to n-type material, so that up to 100% of respective ingots can be used. More typical is a yield of approximately 95% of usable p-type material.

Figure 1:
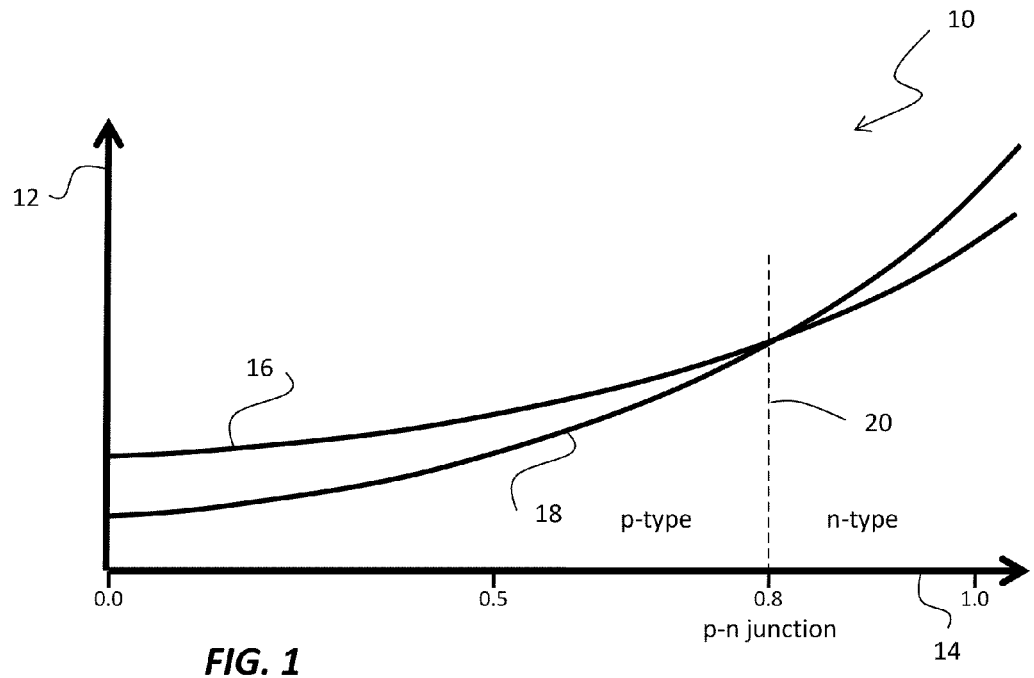

FIG. 1 shows diagram 10 which conceptually portrays the concentration of boron and phosphorus appearing in a silicon feedstock melt for forming a silicon ingot. In diagram 10, ordinate 12 relates to dopant concentration in the silicon melt, while axis 14 represents the stage of silicon ingot formation ranging from 0% (0.0) to 100% (1.0). Line 16 represents the change in boron concentration in the silicon melt, while line 18 represents the change in phosphorus concentration. Initially—close to 0% of ingot formation—B/P ratios>1 might exist.

As conceptual diagram 10 shows, because of the different segregation coefficients of boron and phosphorus, at some point in the silicon ingot formation, the concentration of phosphorus exceeds the concentration of boron. Thus, a silicon melt that began as a p-type semiconductor material will become an n-type semiconductor material. This is shown at line 20. Line 20, therefore, depicts that since the silicon becomes an n-type semiconductor, the resulting silicon ingot exhibits a p-n junction.

Figure 2:
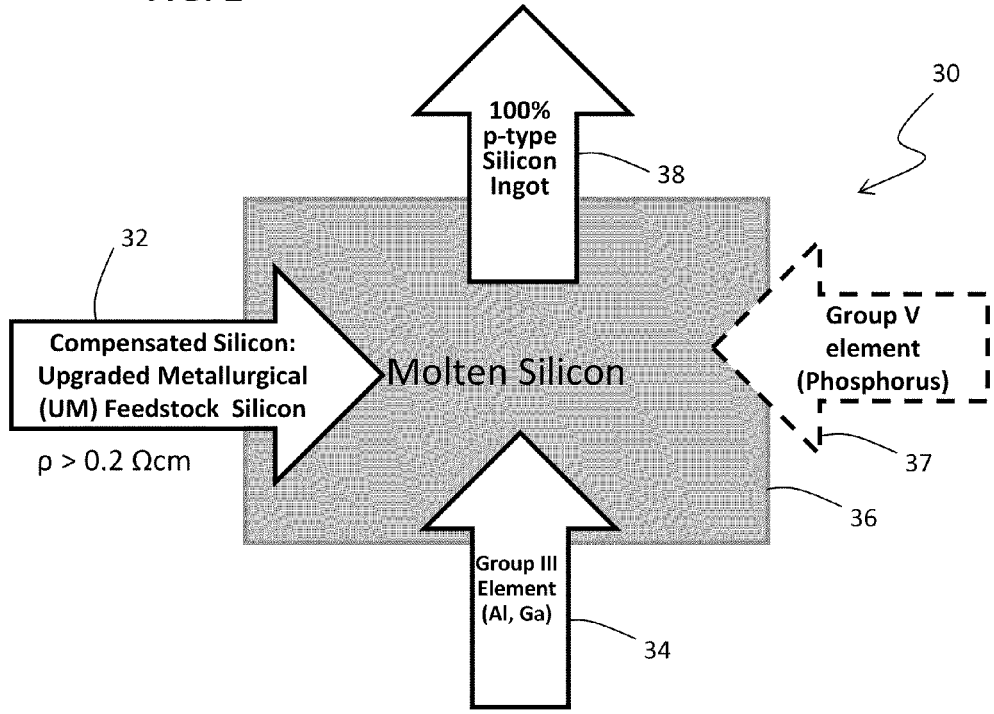
FIG. 2 illustrates conceptually an embodiment of the present disclosure for forming a silicon ingot possessing essentially all p-type silicon material.

FIG. 2 depicts one embodiment of the process 30 of the present disclosure, wherein compensated p-type UMG silicon 32 requires a predetermined amount of a group III element 34, specifically aluminum or gallium, to form molten silicon 36. If the initial resistivity, $\rho$, of UMG silicon 32 ranges between 0.15 $\Omega$cm and 0.5 $\Omega$cm, optionally also phosphorus 37 may be added to a group III element of the above kind. Using a silicon ingot formation process, for example a typical casting process, according to the present disclosure such a process yields a 100% p-type silicon ingot 38.

Figure 3:
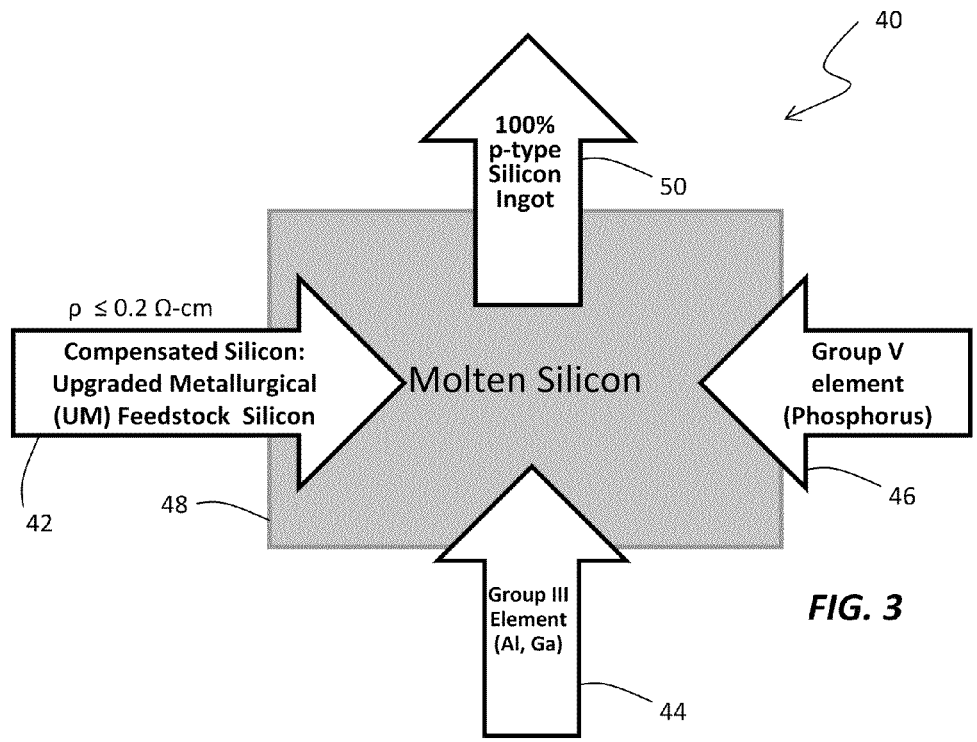
FIG. 3 shows conceptually an alternative embodiment of the present disclosure for forming a silicon ingot possessing essentially all p-type silicon material.

FIG. 3 presents an alternative embodiment of the process 40 of the present disclosure, wherein compensated UMG p-type silicon 42 has an initial resistivity close to the minimum resistivity of ≈0.15 $\Omega$cm of a usable silicon ingot 50. When approaching such a low resistivity, for example 0.2 $\Omega$cm, adding only group III element 44 to the silicon melt 48 is not sufficient. In this case, adding additional phosphorus becomes mandatory in order to end up with 100% p-type ingot 50 in conjunction with a high portion of usable material out of this ingot, typically close to 95% of the total ingot.

Figure 4:
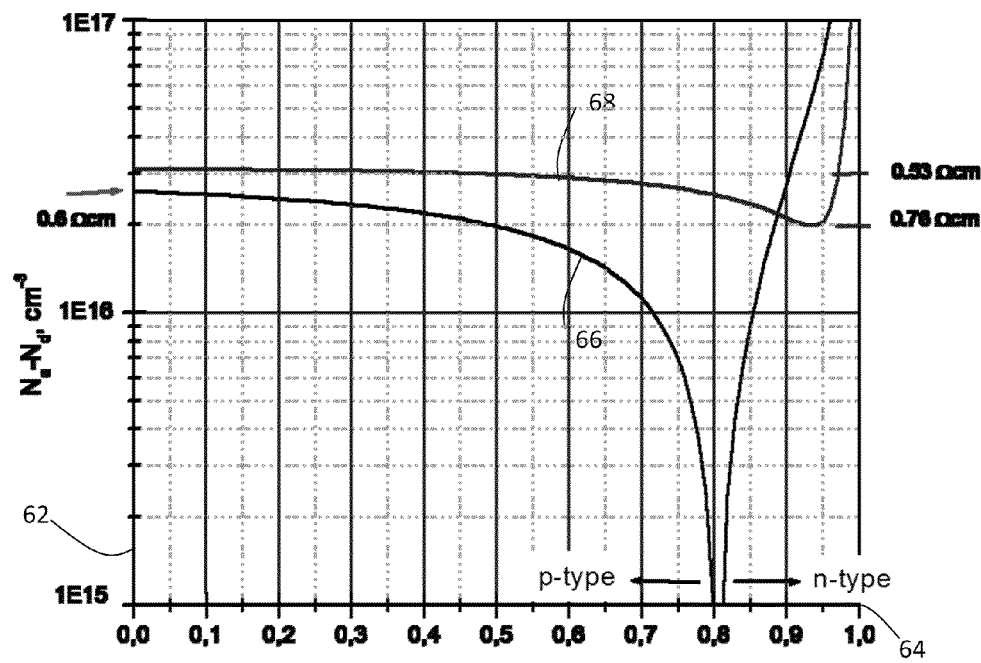
FIG. 4 depicts the axial carrier concentration of an ingot made from compensated UMG silicon feedstock material.

In the following FIGS. 4 through 6 and accompanying text appear axial resistivity plots and description of the resulting silicon ingots from the processes of FIGS. 2 and 3. FIG. 4 depicts the axial carrier concentration of an ingot made from compensated UMG silicon feedstock material with B concentration $5.0 \times 10^{16}$ cm$^{-3}$ and P concentration $2.4 \times 10^{16}$ cm$^{-3}$ (concentration ratio B/P is close to 2). At the beginning of crystallization, i.e. at the bottom of such an ingot, the resistivity is 0.6 $\Omega$cm which corresponds to an initial majority carrier concentration of $2.6 \times 10^{16}$ cm$^{-3}$. Presented is ACCEPTOR CONCENTRATION minus DONOR CONCENTRATION along INGOT HEIGHT, with g being the solidified fraction of an ingot: g=0 means bottom of ingot, g=1 means top of ingot.

FIG. 4, therefore, presents a plot 60 of axial resistivity of a silicon ingot when using UMG silicon feedstock material. In this case we look at materials that lead to an initial resistivity >0.5 $\Omega$cm. Along ordinate 62 we have resistivity-controlling numbers of electron donors, $N_d$, minus numbers of electron acceptors, $N_a$, as appearing in such a silicon ingot (ranging from $1 \times 10^{15}$ to $1 \times 10^{17}$ per cm$^{-3}$). Along abscissa 64 appears a measure of ingot formation completeness, ranging from 0.0 to 1.0, where 1.0 indicates the complete ingot formation. With an initial resistivity of the silicon ingot of 0.6 $\Omega$cm, line 66 shows that without the disclosed process, at approximately 0.8 completeness $N_d$ essentially equals $N_a$. At this point, the amount of phosphorus in the silicon melt balances the amount of boron. The result of this balance becomes first a p-n junction and then, for the remainder of the silicon ingot, an n-type semiconductor material. Using this ingot would mean at least 20% yield loss of usable p-type material.

In contrast to line 66, line 68 demonstrates the effect of adding an amount of gallium sufficient to counteract the effect of the increasing concentration of phosphorus relative to boron (as shown in FIG. 1). Line 68 shows a slight decrease in resistivity in the silicon ingot due to the addition of gallium. However, the addition of gallium further provides the beneficial effect of maintaining the difference between $N_a$ and $N_d$ almost constant throughout a large portion of the silicon ingot. Thus, essentially until the ingot is approximately at 95% of completion, resistivity ranges between 0.53 $\Omega$cm and 0.76 $\Omega$cm, the silicon remains as p-type semiconductor material, and the p-n junction is, thereby, completely avoided. For the specific feedstock silicon in question, the yield loss on the ingot level is reduced by at least 15% absolute, from at least 20% in the state-of-the-art process to approximately 5% in the disclosed process. Another essential advantage is the very tight resistivity range achieved within 95% of usable ingot.

Figure 5:
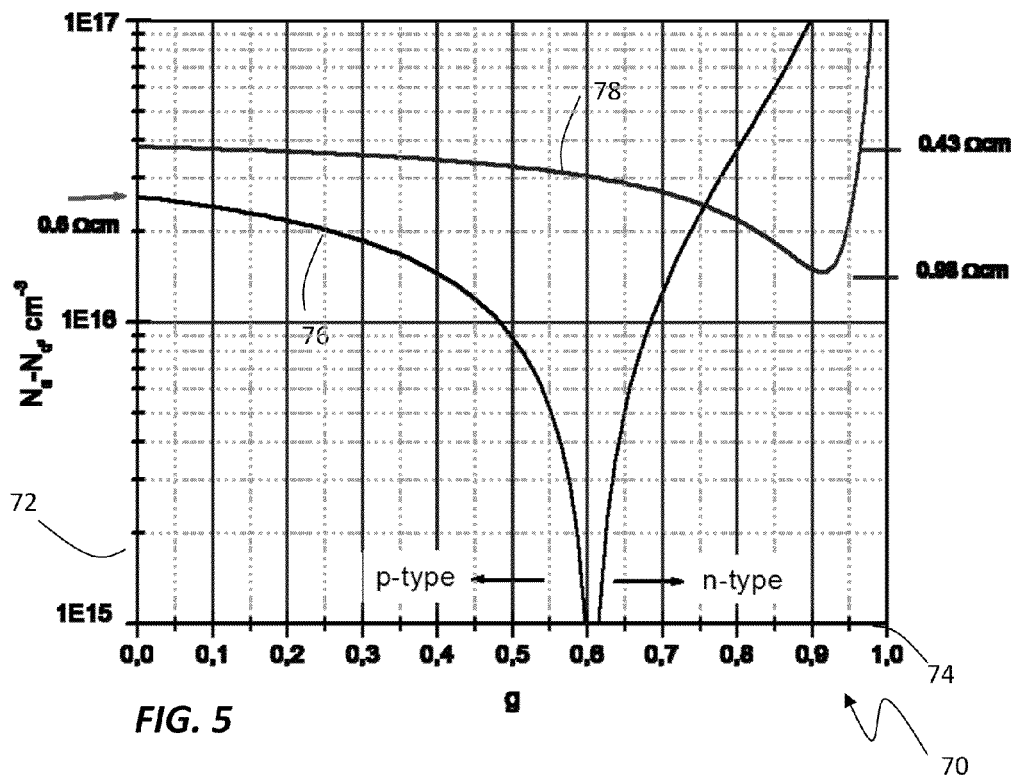
FIG. 5 depicts the axial carrier concentration of an ingot made from differently compensated UMG-Si feedstock material.

FIG. 5 depicts the axial carrier concentration of an ingot made from differently compensated UMG-Si feedstock material with B concentration $7.6 \times 10^{16}$ cm$^{-3}$ and P concentration $5.0 \times 10^{16}$ cm$^{-3}$ (concentration ratio B/P is close to 1.5). At the beginning of crystallization, i.e. at the bottom of such an ingot, the resistivity is again 0.6 $\Omega$cm which corresponds to an initial majority carrier concentration of $2.6 \times 10^{16}$ cm$^{-3}$. Presented is ACCEPTOR CONCENTRATION minus DONOR CONCENTRATION along INGOT HEIGHT, with g being the solidified fraction of an ingot: g=0 means bottom of ingot, g=1 means top of ingot. FIG. 5, therefore, presents a plot 70 of axial resistivity of a silicon ingot also using an UMG silicon material, as shown in FIG. 2. Ordinate 72 for the values of $N_a$-$N_d$ ranges from $1 \times 10^{15}$ to $1 \times 10^{17}$ per cm$^{-3}$. Along abscissa 74 ingot formation completeness ranges from 0.0 to 1.0. With an initial resistivity of 0.6 $\Omega$cm of the silicon ingot, line 76 shows that without the disclosed process, at approximately 0.6 completeness, $N_d$ essentially equals $N_a$. At this point, the amount of phosphorus in the silicon melt balances the amount of boron. The result of this balance becomes first a p-n junction and then, for the remainder of the silicon ingot, an n-type semiconductor material. Using this ingot would mean at least 40% yield loss of usable p-type material.

In contrast to line 76, line 78 demonstrates the effect of adding an amount of gallium sufficient to counteract the effect of the increasing concentration of phosphorus relative to boron. Line 78 shows a slight decrease in resistivity in the silicon ingot due to the addition of gallium. However, the addition of gallium further provides the beneficial effect of essentially reducing the difference between $N_a$ and $N_d$ throughout the almost entire silicon ingot formation. Thus, essentially until the ingot is approximately at the 0.95 completion point, resistivity ranges between 0.43 $\Omega$cm and 0.98 $\Omega$cm and so the silicon remains usable p-type semiconductor material. The p-n junction is completely avoided.

Figure 6:
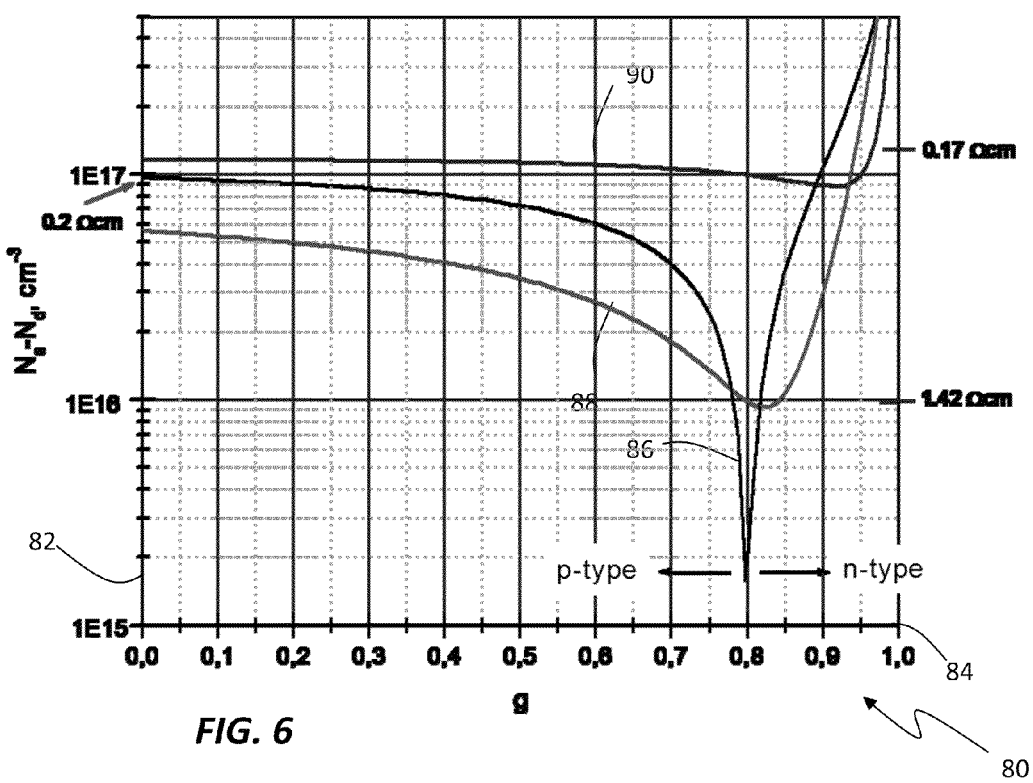
FIG. 6 depicts the axial carrier concentration of an ingot made from another compensated UMG-Si feedstock material.

FIG. 6 depicts the axial carrier concentration of an ingot made from another compensated UMG-Si feedstock material with B concentration $1.86 \times 10^{17}$ cm$^{-3}$ and P concentration $9.0 \times 10^{16}$ cm$^{-3}$ (concentration ratio B/P is close to 2). At the beginning of crystallization, i.e. at the bottom of such an ingot, the resistivity is only 0.2 $\Omega$cm which corresponds to an initial majority carrier concentration of $9.6 \times 10^{16}$ cm$^{-3}$. Presented is ACCEPTOR CONCENTRATION minus DONOR CONCENTRATION along INGOT HEIGHT, with g being the solidified fraction of an ingot: g=0 means bottom of ingot, g=1 means top of ingot. The p-n junction is completely avoided, and resistivity variation is still very low within 95% of the total usable ingot. Thus, for the specific feedstock silicon in question, the yield loss on the ingot level is reduced by at least 35% absolute, from at least 40% in the state-of-the-art process to approximately 5% in the disclosed process.

FIG. 6 presents a plot 80 of axial resistivity of a silicon ingot to demonstrate how the present disclosure may yet beneficially affect the resistivity of feedstock material at the edge of the useful resistivity range, as FIG. 3 depicts. Such a process may use a UMG silicon feedstock material that, while demonstrating a less desirable resistivity of, e.g., approximately 0.2 Ωcm, possesses the highly desirable feature of significantly lower manufacturing costs.

In plot 80, ordinate 82 for the values of $N_d$-$N_a$ ranges from $1 \times 10^{15}$ to $5 \times 10^{17}$ per $cm^{-3}$. Along abscissa 84 ingot formation completeness ranges from 0.0 to 1.0. With an initial resistivity of the silicon ingot of 0.2 Ωcm, line 86 shows that without the disclosed process, at approximately 0.8 completeness, $N_d$ essentially equals $N_a$. Line 90 demonstrates the effect of adding an amount of gallium sufficient to counteract the effect of the increasing concentration of phosphorus relative to boron. However, almost throughout the whole ingot the resulting resistivity is below the already initially very low resistivity of 0.2 Ωcm (resistivity below this value is less useful). Thus, when using feedstock silicon leading to resistivities at the low end of the useful range, with gallium (or aluminum) alone it is practically impossible to bring the material into a more useful resistivity range, even though the p-n junction is still completely suppressed.

Line 88, however, shows a different result. Line 88 shows the result of also adding a certain amount of phosphorus to the feedstock silicon, in addition to the already added gallium or aluminum. As line 88 shows, the effect is to initially increase the resistivity and avoid the p-n junction. Thus, the silicon remains as p-type semiconductor material, and within approximately 95% of the ingot the resistivity ranges from 0.17 Ωcm to 1.42 Ωcm. Only a very small percentage of this material is in the less useful range <0.2 Ωcm, as opposed to the case of adding only the group III element Ga (or, similarly, Al).

Summarizing, at relatively high ingot resistivity (beyond≈0.4 Ωcm) an addition of only aluminum or gallium can advantageously counteract compensation of B due to P. These elements of group III of the periodic system have to be added to the feedstock silicon before melt-down for starting crystallization. Contrary to the case of adding boron, when adding Al or Ga an excellent homogenization of the resistivity along the crystallization axis is obtained, in conjunction with avoiding strong resistivity reduction in the early stage of crystallization (which happens if simply adding B instead of Al or Ga). A mixture of Al and Ga is also possible.

At relatively low ingot resistivity (below≈0.4 Ωcm) one can start adding a combination of Ga and P or, alternatively, of Al and P to advantageously counteract compensation. At very low resistivity (approaching≈0.2 Ωcm) such a combination of a group III element and P becomes mandatory. Applying a certain Ga/P ratio or, alternatively, a certain Al/P ratio (whereby Ga can be partially substituted by Al, and vice versa) can now be exploited to make use of feedstock material with very low resistivity, down to a minimum resistivity of approximately 0.15 Ωcm. Such low-grade material is associated with low production cost.

The present disclosure provides methods for controlling resistivity at growing silicon ingots from compensated feedstock silicon material, comprising, in one embodiment, the steps of:

assessing the concentration of boron and phosphorus that will be initially incorporated into a specific ingot made from compensated feedstock silicon material, determining an appropriate amount of Ga and/or Al (for relatively high resistivity to be expected from above assessment) or, alternatively, determining an appropriate amount of Ga and/or Al and an additional amount of P (for relatively low resistivity to be expected from above assessment), preparing respective feedstock silicon material for being melted to form a silicon melt, by adding predetermined amounts of Ga and/or Al (and likewise P in case of relatively low resistivity to be expected from above assessment), melting and then solidifying the above mixture of feedstock silicon and balanced amounts of Ga and/or Al (and likewise P in case of relatively low resistivity to be expected from above assessment)

by virtue of the adding of the predetermined amount of Ga and/or Al (and likewise P in case of relatively low resistivity to be expected from above assessment) maintaining the homogeneity of the resistivity of the specific silicon ingot throughout the respective ingot.

FIG. 7 presents a plot 100 of axial dopant concentrations in a silicon ingot to demonstrate how the present disclosure may provide a more tightly controlled difference between acceptor and donor dopant atom concentrations.

In plot 100, ordinate 102 for the values of $N_a$ and $N_d$ ranges from $1 \times 10^{16}$ to $1 \times 10^{18}$ per $cm^{-3}$. Along abscissa 104 ingot formation completeness ranges from 0.0 to 1.0. Line 106 shows $N_a$, and line 108 shows $N_d$.

As shown in plot 100, the concentration of acceptor atoms in the silicon melt may be increased stepwise at intervals during ingot formation. This result may be achieved by measuring the dopant concentration of the remaining molten silicon at intervals during crystallization, and thereby inferring the necessary amount of dopant to be added. One way of measuring the molten silicon's dopant concentration is to insert a dip rod (e.g., one made of quartz) into the molten silicon, allowing a portion of the molten silicon to cling to the dip rod and then solidify; the resistivity of this solidified piece of silicon may be measured once it has cooled, and the relative concentration of dopant atoms may be inferred in known ways. The resistivity measurement of the solidified silicon may be accomplished by either contact or contactless (e.g., inductive) measuring. The resistivity measurement may be calibrated by comparing it against samples having known resistivities, in order to eliminate inaccuracies from the measurement.

This procedure may allow all or most of the ingot to be formed as p-type silicon, while also allowing the resistivity to be more tightly controlled, and maintained between predetermined levels. In the ingot shown in plot 100, for example, the transition to n-type silicon is suppressed until approximately 91% formation, shown by line 105. The relative concentration of donor and acceptor atoms is kept reasonably tightly controlled up until approximately the same point, such that, by far, most of the silicon ingot is p-type, with a resistivity in a usable range.

FIG. 8 presents plot 120, showing the axial resistivity profile corresponding to plot 100 in FIG. 7. In plot 120, ordinate 122 for the values of resistivity in Ωcm ranges from 0 to 5. Along abscissa 124 ingot formation completeness ranges from 0.0 to 1.0. Line 126 shows the resistivity of the ingot from plot 100. As shown, the resistivity of that ingot may be maintained in a range of approximately 0.8 to 2.5 Ωcm for approximately 90% of the ingot. In some cases, the resistivity range may be approximately 0.3 to 4 Ωcm. In some other cases, the resistivity range may be 0.15 to 5 Ωcm.

However, in some cases it may be undesirable for an ingot to have an axial resistivity profile that varies discontinuously or almost discontinuously, such as the profile shown in plot 120. To avoid such discontinuities, the present disclosure provides methods as follows for continuously varying the amount of dopant flowing into the molten silicon.

FIG. 9 presents a plot 140 of axial dopant concentrations in a silicon ingot, both with and without the continuous-flow doping of the present disclosure. Plot 140 presents ordinate 142 for the values of $N_a$ and $N_d$, which ranges from $1 \times 10^{14}$ to $1 \times 10^{19}$ per cm$^{-3}$. Along abscissa 144 ingot formation completeness ranges from 0.0 to 1.0.

Line 146 shows the donor concentration as it increases due to the less-than-one segregation coefficient of phosphorus. Line 148 shows the acceptor concentration, which increases both because of the less-than-one segregation coefficient of the acceptor dopants, and also because new dopant atoms are continuously being fed into the molten silicon. Line 150 shows what would be the net dopant concentration in the ingot if no additional dopant were added to the melt during ingot formation; line 150 assumes that the initial concentrations of donor and acceptor atoms are the same as in lines 146 and 148 (i.e. shown by the intersections of lines 146 and 148 with ordinate 142), respectively. Line 151 marks the p-n junction and transition to n-type material that would occur in line 150 if no additional dopant were added to the melt during ingot formation. Line 152, by contrast, shows the relatively flat net dopant concentration that may be achieved by the continuous-flow methods of the present disclosure.

FIG. 10 presents plot 160 showing the axial resistivity profile that corresponds to line 152 in the continuously doped ingot from plot 140. As shown, resistivity 162 may be maintained relatively constant throughout substantially all of ingot formation. More typically, resistivity may be maintained relatively constant through at least 90% of ingot formation. In some cases, resistivity may be maintained in the range of approximately 1.0 to 1.5 Ωcm.

FIG. 11 shows two enlarged views from plots of the type shown in plot 100. View 170 is similar to the graph shown in plot 100, with the molten silicon successively doped with acceptor atoms to form a p-type ingot with resistivity constrained to a predetermined range.

View 172 shows another embodiment of the present disclosure, with a higher concentration of donor atoms than acceptor atoms. This view shows that the present disclosure may be adapted to producing n-type silicon with resistivity constrained to a predetermined range, simply by changing the initial concentrations of dopant atoms, and then successively adding acceptor dopant in the correct quantities to keep resistivity to a desired range. N-type silicon may be desirable in some circumstances, but it may need to have resistivity in a certain range in order to be useful. The present disclosure provides a simple way of producing low-cost n-type silicon with resistivity constrained to a predetermined range. One of ordinary skill will recognize that the continuous-flow methods of the present disclosure may also be adapted to producing n-type silicon with a relatively flat axial resistivity profile.

FIG. 12 shows an embodiment of a continuous-flow doping setup. Compensated UMG silicon is placed into crucible 180 and melted. At the stage shown in FIG. 12, recrystallization has already begun. Silicon ingot 181 is shown at the bottom of crucible 180, underneath molten silicon 182. At intervals during recrystallization, dip probe 183 is inserted into molten silicon 182 to remove a portion for testing. The removed portion of molten silicon (not shown) is then solidified outside the crucible and its resistivity is measured at step 184. The measured resistivity is then fed into a computer model of the process at step 185, which reveals the relative dopant concentrations and the necessary doping adjustment. The results of that calculation are fed into a feeder control system at step 186, which then adjusts the flow rate of dopant entering the melt through feeder 187. The dopant flowing into crucible 180 may be a powdered doped silicon, or any other type of dopant that may continuously flow. Using doped silicon powder may allow greater control over the dopant level in molten silicon 182 than using, e.g., pure dopant.

The semiconductor processing features and functions described herein provide for resistivity control in the formation of p-type and n-type semiconductor ingots. Although various embodiments which incorporate the teachings of the present disclosure have been shown and described in detail herein, those skilled in the art may readily devise many other varied embodiments that still incorporate these teachings. The foregoing description of the specific embodiments, therefore, is provided to enable a person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein, but is to be accorded the widest scope consistent with the principles and novel features disclosed herein.

What is claimed is:

1. A method for controlling resistivity in the formation of a silicon ingot, comprising the steps of:
   preparing a compensated, upgraded metallurgical silicon feedstock for being melted to form a silicon melt, said compensated, upgraded metallurgical silicon feedstock comprising a predominantly p-type semiconductor;
   assessing quantitatively the relative concentrations of boron and phosphorous in said compensated, upgraded metallurgical silicon feedstock;
   adding to said compensated, upgraded metallurgical silicon feedstock a greater-than-zero quantity of phosphorous if an initial resistivity of the upgraded metallurgical silicon feedstock is below a threshold resistivity;
   adding to said compensated, upgraded metallurgical silicon feedstock a greater-than-zero quantity of gallium, wherein said quantitatively assessed relative concentrations of boron and phosphorous determine said greater-than-zero quantity of gallium;
   melting said upgraded metallurgical silicon feedstock and said greater-than-zero quantity of gallium to form a molten silicon solution including said greater-than-zero quantity of gallium; and
   performing a directional solidification of said molten silicon solution for forming a silicon ingot and, by virtue of said adding said greater-than-zero quantity of suppressing the transition of said silicon ingot to n-type material and maintaining the resistivity of said silicon ingot within an operational range to approximately 95% solidification by virtue of reducing the effect of differing boron and phosphorous segregation coefficients.

2. The method of claim 1, further including performing a resistivity measurement to determine the greater-than-zero quantity of gallium, wherein performing the resistivity measurement includes:
   inserting a rod into said molten silicon solution;
   allowing a portion of said molten silicon solution to solidify on said rod; and
   measuring the resistivity of said solidified portion of said molten silicon solution.

3. The method of claim 2, wherein said rod comprises quartz.

4. The method of claim 1, wherein said step of performing resistivity measurements comprises contactless measuring.

5. The method of claim 1, wherein the gallium is in a substantially pure elemental form.

6. The method of claim 1, wherein the gallium is in a doped-silicon form.

7. A method for controlling resistivity in the formation of a silicon ingot, comprising the steps of:
preparing a compensated, upgraded metallurgical silicon feedstock for being melted to form a silicon melt, said compensated, upgraded metallurgical silicon feedstock comprising a predominantly n-type semiconductor;
assessing quantitatively the relative concentrations of boron and phosphorous in said compensated, upgraded metallurgical silicon feedstock;
adding to said compensated, upgraded metallurgical silicon feedstock a greater-than-zero quantity of phosphorous if an initial resistivity of the upgraded metallurgical silicon feedstock is below a threshold resistivity;
adding to said compensated, upgraded metallurgical silicon feedstock a greater-than-zero quantity of gallium wherein said quantitatively assessed relative concentrations of boron and phosphorous determine said greater-than-zero quantity of gallium;
melting said upgraded metallurgical silicon feedstock and said greater-than-zero quantity of gallium to form a molten silicon solution including said greater-than-zero quantity of gallium; and
performing a directional solidification of said molten silicon solution for forming a silicon ingot and, by virtue of said adding said greater-than-zero quantity of gallium, maintaining the resistivity of said silicon ingot within a predetermined range to approximately 95% solidification by virtue of reducing the effect of differing boron and phosphorous segregation coefficients.

8. The method of claim 7, further including performing a resistivity measurement to determine the greater-than-zero quantity of gallium, wherein performing the resistivity measurement includes:
inserting a rod into said molten silicon solution;
allowing a portion of said molten silicon solution to solidify on said rod; and
measuring the resistivity of said solidified portion of said molten silicon solution.

9. The method of claim 8, wherein said rod comprises quartz.

10. The method of claim 7, wherein said step of performing resistivity measurements comprises contactless measuring.

11. The method of claim 7, wherein the gallium is in a substantially pure elemental form.

12. The method of claim 7, wherein the gallium is in a doped-silicon form.

* * * * *